(12) United States Patent
Godau et al.

(10) Patent No.: US 10,394,211 B2
(45) Date of Patent: Aug. 27, 2019

(54) ELECTRONIC SAFETY SWITCHING DEVICE

(71) Applicant: PILZ GMBH & CO. KG, Ostfildern (DE)

(72) Inventors: Thorsten Godau, Ostfildern (DE); Norbert Froehlich, Ostfildern (DE); Matthias Holzaepfel, Ostfildern (DE); Hans Schwenkel, Ostfildern (DE)

(73) Assignee: PILZ GMBH & CO. KG, Ostfildern (DE)

( * ) Notice: Subject to any disclaimer, the term of this patent is extended or adjusted under 35 U.S.C. 154(b) by 222 days.

(21) Appl. No.: 15/653,968

(22) Filed: Jul. 19, 2017

(65) Prior Publication Data
US 2017/0315530 A1    Nov. 2, 2017

Related U.S. Application Data

(63) Continuation of application No. PCT/EP2016/051149, filed on Jan. 20, 2016.

(30) Foreign Application Priority Data

Jan. 23, 2015   (DE) ........................ 10 2015 101 023

(51) Int. Cl.
*G05B 19/042*   (2006.01)
*H01L 25/16*   (2006.01)

(52) U.S. Cl.
CPC ........ *G05B 19/0428* (2013.01); *H01L 25/162* (2013.01); *G05B 2219/24008* (2013.01); *H01L 2224/48091* (2013.01)

(58) Field of Classification Search
CPC .. G05B 9/00–03; G05B 19/0423–0428; H01L 25/162
See application file for complete search history.

(56) References Cited

U.S. PATENT DOCUMENTS 6,784,571 B2   8/2004   Rupp et al.
7,335,974 B2 *   2/2008   Hwang ................... B81B 7/007
257/685

(Continued)

FOREIGN PATENT DOCUMENTS

DE        100 53 820 A1   5/2002

OTHER PUBLICATIONS

Tezzaron 3D Memory Technology 101; We do not believe 3D is a packaging technology . . . we believe it is an architecture enabler.; Jan. 2015; 6 pp.

(Continued)

*Primary Examiner* — Joseph R Kudirka
(74) *Attorney, Agent, or Firm* — Harness, Dickey & Pierce, P.L.C.

(57) ABSTRACT

An electronic safety switching device comprising at least a first and a second signal processing channel to which input signals may be supplied for signal processing. The first and second signal processing channels provide processed output signals, wherein the first and the second signal processing channels process the supplied input signals redundantly with respect to one other. The first and the second signal processing channels are each formed as integrated circuits, wherein the first signal processing channel is arranged monolithically on a first semiconductor substrate, and the second signal processing channel is arranged monolithically on a second semiconductor substrate. Furthermore, the first and the second semiconductor substrates are combined into a stack to form a one-piece electronic component.

11 Claims, 4 Drawing Sheets

(56) References Cited

U.S. PATENT DOCUMENTS

| | | | |
|---|---|---|---|
| 8,134,235 B2* | 3/2012 | Chiou | H01L 21/76898 |
| | | | 257/774 |
| 9,408,291 B2 | 8/2016 | Ott | |
| 2003/0178961 A1 | 9/2003 | Rupp et al. | |
| 2012/0193681 A1 | 8/2012 | Or-Bach | |
| 2013/0176763 A1 | 7/2013 | Ware et al. | |
| 2013/0231767 A1 | 9/2013 | Sabapathy et al. | |
| 2013/0241025 A1* | 9/2013 | Pagani | H01L 21/768 |
| | | | 257/499 |

OTHER PUBLICATIONS

IEC 61511; May 2005; 3 pp.

DIN EN 61508; International Standard; Functional safety of electrical/electronic/programmable electronic safety-related systems—Part 2: Requirements for electrical/Electronic/Programmable electronic safety-related systems; May 2000; 152 pp.

International Search Report for PCT/EP2016/051149; dated Apr. 7, 2016; 13 pp.

English translation of International Preliminary Report on Patentability (Chapter 1) for PCT/EP2016/051149; dated Aug. 3, 2017; 11 pp.

\* cited by examiner

ELECTRONIC SAFETY SWITCHING DEVICE

CROSS-REFERENCES TO RELATED APPLICATIONS

This application is a continuation of international patent application PCT/EP2016/051149, filed on Jan. 20, 2016 designating the U.S., which international patent application has been published in German language and claims priority from German patent application DE 10 2015 101 023.2, filed on Jan. 23, 2015. The entire contents of these priority applications are incorporated herein by reference.

BACKGROUND OF THE INVENTION

The present invention relates to an electronic safety switching device having at least a first and a second signal processing channel.

Safety switching devices of this kind are primarily used in the industrial sector and may be encountered in almost all areas of mechanical and plant engineering. Safety switching devices carry out defined safety functions, for instance, providing a controlled and safe stopping of movement of a technical installation or monitoring the position of a moving installation. Generally, safety switching devices are configured to initiate a safe and reliable response if a fault occurs and if protected areas are breached.

There are very high demands placed on the fail-safety of such safety switching devices. Thus, safety switching devices must generally first been approved by an regulatory authority before they are allowed to be used in industrial applications. For example, in Germany, the professional associations or the TÜV (German Technical Inspection Association) carries out such approvals. Relevant standards for functional safety are, for instance, DIN EN 61508 for developing electrical, electronic, and programmable electronic (E/E/PE) systems or EN 61511 for developing technical safety systems for the processing industry. These standards define, inter alia, safety integrity levels (SILs) which are used for assessing (E/E/PE) systems in terms of reliability of their safety functions. In the context of the present disclosure, safety switching devices are those devices which satisfy at least the requirements of SIL2.

A known and frequently used measure for achieving this required fail-safety, is to configure the safety switching device redundantly with multiple channels, wherein at least two signal processing channels are monitoring each other. If a fault occurs in one of the signal processing channels, the second signal processing channel is capable of detecting said fault and effectuating a safe state for persons in the area of the machinery. Under this approach, particular attention must be given to possible causes of faults which affect multiple, or all, redundant signal processing channels in the same manner (so-called common-cause faults); otherwise, the required fail-safety cannot be ensured.

Furthermore, a frequently used approach by the relevant regulatory authorities when approving safety switching devices is to request from the designer or manufacturer of the safety switching device an exhaustive, detailed fault analysis in which any conceivable fault is recorded. It must be demonstrated therein that the safety switching device can effectuate a safe state for persons in a reliable manner, even if the respective fault occurs. Such an analysis is highly complex, in particular in the case of complex safety switching devices having numerous functions, and thus has an adverse effect on development and production. In addition, this failure analysis must be repeated even in the case of slight changes in the design or the structure of the safety switching device, since, for example, new fault sources may be created solely due to a spatially different arrangement of components which are otherwise identical.

For this reason, DE 100 53 820 A1 suggests an electronic safety switching device in which the essential components of the redundant signal processing channels are formed from integrated semiconductor circuits which are arranged on a single semiconductor chip. This so-called on-chip redundancy, in which a single integrated and invariable component is provided while maintaining the separate signal processing channels, has the advantage that the fault analysis required by the regulatory authority for the approval must be performed only once. Later checks may subsequently be limited to quantitatively checking adherence to the specifications defined during the development of the semiconductor chip, in particular adherence to intended spatial dimensions and materials used.

However, due to the particular architectural requirements which must be taken into account during the design and development of semiconductor chips having on-chip redundancy, such chips are often one-off products and are generally more expensive than common semiconductor chips having redundant structures, for example, modern multi-core processors which are used for parallel processing. Thus, in semiconductor chips which have on-chip redundancy and are used for safety-critical applications, separate physical blocks must be formed on the semiconductor substrate for each channel and for each monitoring element, for example, a watchdog, said blocks being arranged having a defined spacing from each other and thus not being able to influence one another. In addition, each channel must have its own separate inputs and outputs, which are not allowed to pass through one of the other blocks. As a result, the chip design becomes particularly complex, and the integrated circuits generally require higher-than-average area on a semiconductor substrate, thereby in turn increasing the cost of a single chip.

In addition, there are application areas which strictly forbid the use of systems having on-chip redundancy. Thus, for example, when using non-contact protective devices (electro-sensitive protective equipment or ESPE), no systems may be employed in which the signal processing units of the individual channels are arranged on one semiconductor substrate. Therefore, such protective devices cannot use known on-chip redundancy systems.

SUMMARY OF THE INVENTION

It is an object of the present invention to provide a safety switching device which is compact. Further, it is an object to provide a safety switching device which is economical and efficient. Yet further, it is an object to provide a safety switching device which is usable for all common protective devices.

In accordance with an aspect of the present disclosure there is provided an electronic safety switching device comprising at least a first and a second signal processing channel to which input signals may be supplied for signal processing, and which provide processed output signals, wherein the first and the second signal processing channels process the supplied input signals redundantly with respect to one other, and each of the first and the second signal processing channel is formed as an integrated circuit, wherein the first signal processing channel is arranged monolithically on a first semiconductor substrate, and the second signal processing channel is arranged monolithically on a second semiconductor substrate, and wherein the first and the second semiconductor substrates are combined into a stack to form a one-piece electronic component.

It is thus an idea to use, in contrast to known on-chip redundancy systems, two separate semiconductor substrates which are stacked on top of another and thus form a single electronic component. The integrated circuits of the first signal processing channel form a first layer and the integrated circuits of the second signal processing channel form a corresponding second layer, which lies underneath the first layer. The two separate semiconductor substrates advantageously lie in two parallel layers which are offset from one another in a direction orthogonal to the layers. The individual integrated circuits on the respective semiconductor substrate may be designed independently of one another. Thereby, particular architectural requirements for integrated circuits with on-chip redundancy do not have to be taken into account. Thus, the design of the integrated circuits can be simplified by using a standard design. In addition, the integrated circuits may be arranged on the respective semiconductor substrate in an effective and space-saving manner, without having to adhere to particular technical safety requirements. Thereby, the design can be more compact and production costs can be reduced.

In addition, using two semiconductor substrates which are separate from one another has the advantage that such an electronic safety switching device may also be used for technical safety applications which do not allow the use of systems having on-chip redundancy due to current safety regulations. Thus, such a safety switching device may also be used in particular for non-contact protective devices which previously had to use electronic safety switching devices having signal processing which is carried out completely separately via separate components and semiconductor chips. The new safety switching device may thus be used in a versatile and flexible manner using common protective devices.

In addition, the safety switching device has the advantage that the stack may be combined into a one-piece component. In this context, "one-piece" means in particular that the finished electronic component is no longer modifiable afterwards. In other words, the structure of the electronic component is already defined in an invariable form during development and design, but the final component is assembled from separate semiconductor substrates into the one-piece component during the manufacturing process. Preferably, the semiconductor substrates are set directly on top of each another in the stack and are permanently connected together into the one-piece component. It is particularly advantageous if, after connecting the semiconductor substrates together into the stack, the one-piece component is enclosed by a molding material which is deposited in a form-fitting manner around the semiconductor substrates. Thereby, an integrated, multi-channel logic component is formed which can easily be positioned on a printed circuit board in automated placement processes. Advantageously, a fault analysis conducted for approval by the regulatory authority must be carried out only once, and later checks are limited to a conformity test in which the adherence to the design specifications is verified. Such checks are simpler and more economical than a repeated full fault analysis.

Overall, the new safety switching device thus combines the advantages of an on-chip redundancy system with the advantages of a system which is configured having two independently redundant signal processing systems.

In a refinement, the stack comprises an additional semiconductor substrate.

In this refinement, in addition to the first and the second semiconductor substrate, an additional semiconductor substrate is arranged in the stack, which is either configured in a manner similar to the other semiconductor substrates, or comprises structures which are able to exercise other functions. Thus, a "system-on-stack" (SoS) may be configured in a simple manner, and can reproduce the relevant functions of a safety switching device in a chip, and simultaneously provides a structural partitioning.

In a further refinement, the first semiconductor substrate comprises a first signal processing unit, the second semiconductor substrate comprises a second signal processing unit, and the additional semiconductor substrate comprises a control and memory structure, wherein the first and the second signal processing units are coupled to the control and memory structure.

In this refinement, the additional semiconductor layer is configured as a control and memory structure which, for example, may comprise a comparator, a "watchdog," interfaces to peripherals, or RAM/ROM memory. Thereby, the signal processing units may be configured in a particularly simple manner, and may optionally use a standard design, wherein commonly used elements may be arranged on the additional semiconductor substrate. Thus, various components may be combined into a "system-on-stack," in order to implement robust and economical safety switching devices. In addition, by the arrangement of the additional elements of a safety switching device within the one-piece component, other fault sources may be reliably ruled out in advance. In particular, wiring faults, which may occur when wiring discrete components using conductor cables, may thus be prevented.

In further refinement, the additional semiconductor substrate is arranged in the stack between the first and the second semiconductor substrates.

In this refinement, the first semiconductor substrate covers a first side face of the additional semiconductor substrate, and the second semiconductor substrate covers a side face of the additional semiconductor substrate opposite to the first side face. In other words, the stack is configured like a layer system, wherein the additional semiconductor substrate forms a middle layer. Preferably, the first and the second semiconductor substrates cover the additional semiconductor substrate completely on the respective side. Thereby, the middle layer, in particular the memory structures arranged on it, are physically protected via the first and the second semiconductor substrate layers, so that particle and wave influences on the middle layer may be minimized. Advantageously, "sensitive" RAM memory may thus be reliably protected from external influences.

In a further refinement, the first and the second semiconductor substrates are arranged spatially distanced from one another in the stack.

In this refinement, the first and second semiconductor substrates thus do not lie directly on top of one another in the stack, but are spatially separate from one another. This measure has the advantage that the integrated circuits of the semiconductor substrates may be arranged spaced apart from one another, whereby crosstalk of signals or short circuits between the processing units are physically prevented.

In a further refinement, an insulation layer and/or an additional semiconductor substrate are arranged between the first and the second semiconductor substrates.

This refinement has the advantage that the first and the second semiconductor substrates may be arranged at a defined spacing from one another. Thus, an insulation layer may be added in order to electrically decouple the two semiconductor substrates from one another, whereby crosstalk and short circuits between the integrated circuits may be eliminated. In particular, an additional semiconductor substrate may also be arranged between the first and the second semiconductor substrates, said additional semiconductor substrate exercising functions which may be used by the semiconductor circuits on the first semiconductor substrate and/or the second semiconductor substrate. It should be understood that a combination made up of insulation layers and semiconductor substrates may also be used as an intermediate layer in order to combine the aforementioned advantages.

In a further refinement, the stack comprises at least two semiconductor substrates and at least one vertical contact element, wherein the vertical contact element electrically connects the at least two semiconductor substrates.

In this refinement, the integrated circuits are arranged on different semiconductor substrates, but are connectable via vertical contact elements within the stack. This measure has the advantage that the semiconductor circuits on the first and the second semiconductor substrates may be interconnected in a simple manner, in order, for example, to enable inter-process communication and to enable monitoring of the individual signal processing channels via the respective other signal processing channel.

Alternatively, it would also be conceivable to interconnect the redundant signal processing channels externally, i.e., outside the semiconductor substrates, for mutual data exchange. However, on the other hand, the preferred measure has the advantage that a fault analysis for mutual data exchange must be carried out only once as well during the development of the chip stack, and faults during installation of the signal processing channel may be reduced. In addition, it is possible for an internal data exchange via vertical contact elements to be faster and freer from interfering environmental influences.

In a further refinement, the first semiconductor substrate comprises a first signal processing unit, and the second semiconductor substrate comprises a second signal processing unit, wherein the first signal processing unit comprises an operating cycle which is time-shifted with respect to the second signal processing unit.

In this refinement, the first and the second signal processing units having a processor clock which defines a fixed, preferably identical, operating cycle of the signal processing units. The operating cycle of the first signal processing unit is shifted with respect to the operating cycle of the second signal processing unit by at least one clock cycle. This measure has the advantage that faults due to a common cause may be better detected in a simple manner. Thus, faults which occur simultaneously, for example, a simultaneous voltage spike in both signal processing channels, may be discovered via the time offset in the processing of the signals by the signal processing units. Preferably, both signal processing units operate using a uniform processor clock which is shifted by one phase for the time offset.

In a further refinement, the safety switching device comprises a first voltage supply, and a second voltage supply which is separate from the first voltage supply, wherein the first voltage supply is associated with the first semiconductor substrate, and the second voltage supply is associated with the second semiconductor substrate.

In this refinement, the first and the second semiconductor substrates are respectively supplied by a separate voltage supply which, in addition, preferably has its own monitoring circuit to protect it from overvoltages. This measure has the advantage that a separate voltage supply is available to each semiconductor substrate and its integrated circuits, and the risk of a failure due to a faulty voltage supply or an unexpected overvoltage may be minimized. By means of this measure, the fail-safety of the safety switching device is further increased.

It is to be understood that the aforementioned features and the features to be explained hereinafter are applicable not only in the respective specified combination, but also in other combinations or alone, without departing from the scope of the present invention.

BRIEF DESCRIPTION OF THE DRAWINGS

Exemplary embodiments of the present invention are depicted in the drawing and are explained in greater detail in the description below. The following are shown.

DESCRIPTION OF PREFERRED EMBODIMENTS

Figure 1:
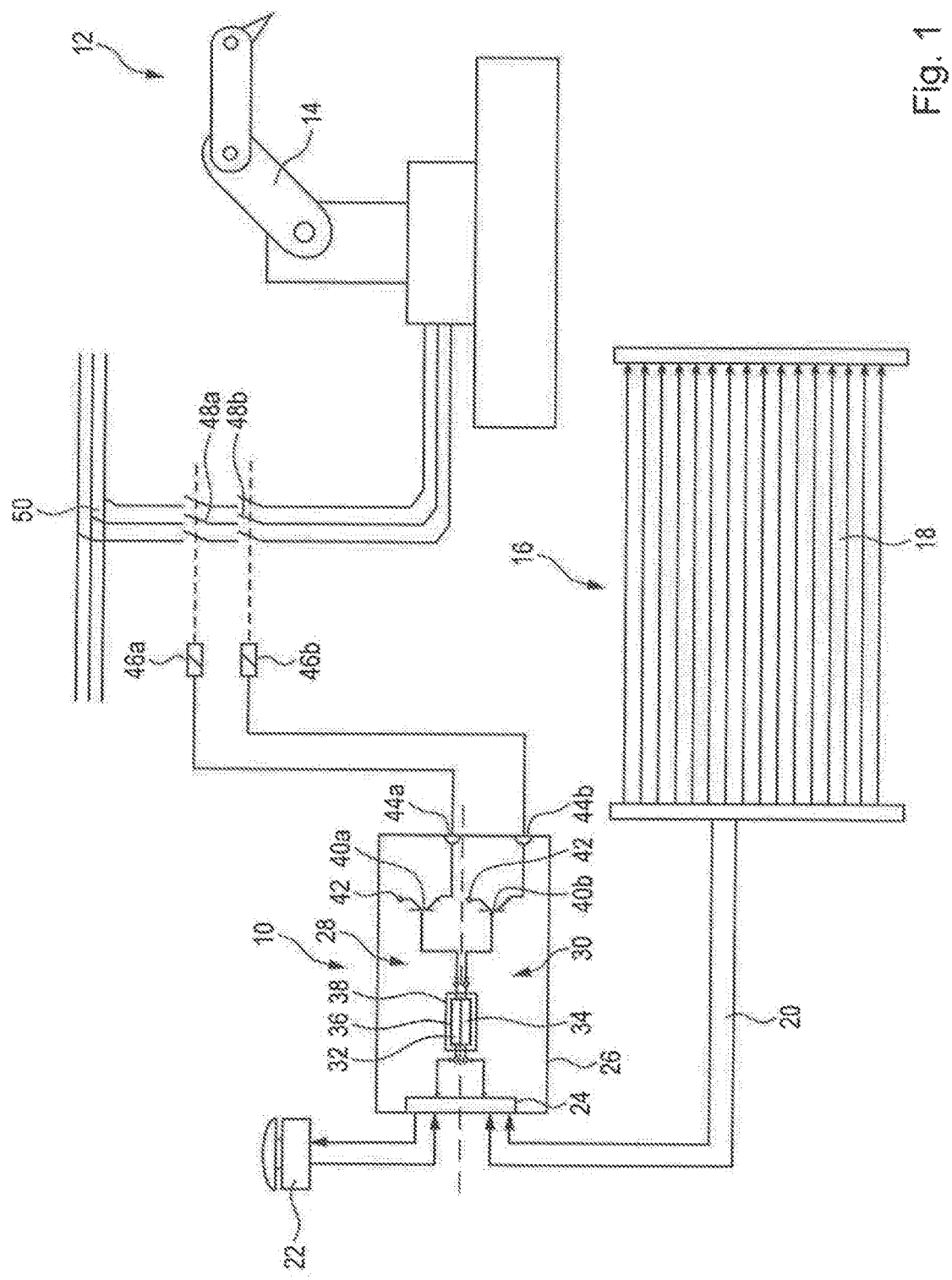
FIG. 1 shows a simplified depiction of a preferred exemplary embodiment of the new safety switching device on a machine installation.

In FIG. 1, an exemplary embodiment of the new electronic safety switching device in its entirety is denoted with the reference numeral 10.

In this exemplary embodiment, the safety switching device is associated with a technical system 12, which is illustrated here by a robot 14. During operation, the robot 14 poses a risk to a person who is in the operating area of the robot 14. For this reason, the operating area of the robot 14 is secured from unauthorized access by a protective device 16. In the case depicted here, the protective device 16 is a non-contact protective device in the form of a light grid 18, which is arranged in the access area to the technical system 12 in such a way that a person or an object which enters the access area interrupts at least one of a plurality of light beams which are transmitted between a transmitter/receiver combination of the light grid 18.

The light grid 18 is connected to the safety switching device 10 via cables 20 and supplies it with input signals as a function of the current state. In the case of an active protective device like the light grid 18 depicted here, redundant input signals, so-called OSSD signals, are independently generated by the protective device and transmitted to the safety switching device 10. Passive protective devices, such as the emergency stop button 22 depicted here, generally receive an output supplied by the safety controller 10 and loop it as an input signal back to the safety switching device 10.

In this exemplary embodiment, the safety switching device 10 comprises an I/O unit 24 with a plurality of connectors for receiving the input signals and for providing output signals. In some exemplary embodiments, these connectors are connection terminals which are arranged on a surface of the housing 26 of the safety switching device 10, for example, in the form of spring-loaded terminals or screw terminals. In other exemplary embodiments, the connectors may be plugs or sockets which contain multiple contact elements, wherein each pin forms a connector. M8 sockets having five contact pins are frequently used for connecting protective devices or other sensors at the field level.

In the case depicted here, the light grid 18 generates two redundant input signals (OSSD1, OSSD2), which are supplied to the safety switching device 10 via separate cables 20. In other exemplary embodiments, the input signals may likewise be transmitted via two wires of a single connection cable. It is also conceivable that the input signals are transmitted to the safety switching device 10 via a bus, for example, a secure fieldbus. In such a case, the I/O unit 24 is configured as a communication module which implements the protocol of the bus used. The input signals may be read out of the communication module and provided to the safety switching device 10 as a redundant input signal pair.

In the present exemplary embodiment, the safety switching device 10 comprises a first signal processing channel 28 and a second signal processing channel 30 which are designed to be redundant with respect to one other, and are designed to evaluate the input signals of a protective device 16, 22 redundantly with respect to one another. The two signal processing channels 28, 30 are at least partially integrated circuits, wherein the integrated circuit of the first signal processing channel 28 is arranged on a first semiconductor substrate 32, and the integrated circuit of the second signal processing channel 30 is arranged on a second semiconductor substrate 34. The first and second semiconductor substrates 32, 34 are combined into a chip stack 36 and encapsulated into a one-piece electronic component 38 in a manner known per se.

In preferred exemplary embodiments, all essential components of a signal processing channel are integrated circuits on a semiconductor substrate, and the semiconductor substrates are combined into a stack 36. Thus, a chip stack 36 preferably contains inputs and outputs, central processing units, memories, comparators, and A/D converters, with which the input signals may be processed in a fail-safe manner. Alternatively or in addition, the signal processing channels 28, 30 may also comprise additional discrete components which are not configured as an integrated circuit. In the case depicted here, the safety switching device 10 comprises, for example, switching elements 40a, 40b, one per signal processing channel 28, 30, each of which is capable of switching a high voltage potential 42 to a device connection 44a, 44b of the safety switching device 10, in order to enable a current flow to a contactor 46a, 46b, or to interrupt this current flow. Thus, each switching element 40 may deactivate an actuator such as a contactor 46 or a magnetic solenoid valve.

The contactors 46a, 46b respectively comprise normally open contacts 48a, 48b. Here, the normally open contacts 48a, 48b are arranged in series with one other in a current supply path from a current supply 50 to the robot 14. As soon as the safety switching device 10 switches off the contactors 46a, 46, the contacts 48 disengage, and the current supply 50 for the robot 14 is disconnected. It will be clear to the relevant experts that such "radical" disconnection is described here only by way of example. In deviation, in the event of a safety request, only parts of the robot 14 may also be deactivated, for example, the hazardous drives, while other parts of the robot 14 remain functional. A delayed deactivation is also conceivable, so that the robot 14 may optionally be stopped in a controlled manner before deactivating the drives.

It should be understood that safety switching devices are not limited to the embodiment depicted here. Safety switching devices in the context of the present disclosure also comprise, for example, configurable safety switching devices, programmable safety controllers, or secure modules of a standard controller.

Figure 2:
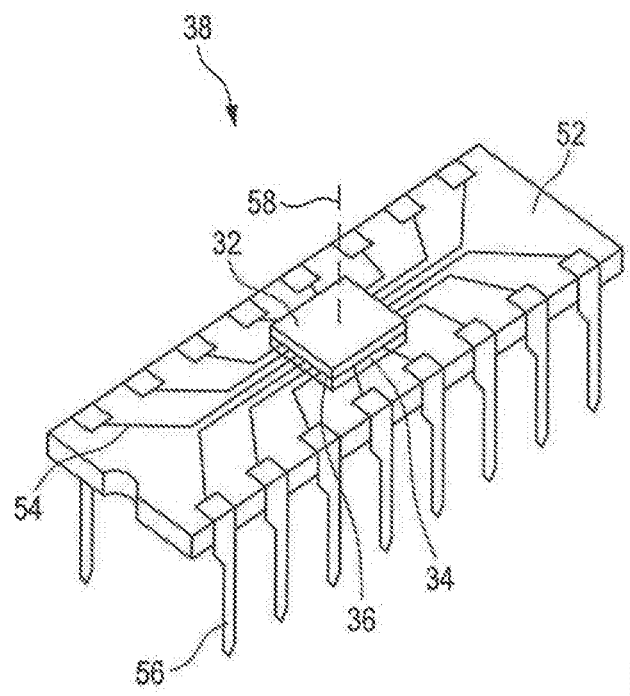
FIG. 2 shows a perspective view of an exemplary embodiment of one-piece electronic component of the new safety switching device.

FIG. 2 shows a highly simplified representation of an embodiment of a one-piece electronic component 38. The same reference numbers designate the same parts as previously in FIG. 1.

The one-piece electronic component 38 is implemented here as a microchip comprising a dual inline package (DIP) housing. A chip stack 36 comprising a first semiconductor substrate 32 and a second semiconductor substrate 34 is arranged on a carrier 52 inside the DIP housing. The semiconductor structures are connected to conducting paths 54 on the two semiconductor substrates 32, 34 via suitable connecting means such as bonding. The conducting paths 54 are in turn connected to contact pins 56 via which the semiconductor structures are contactable from the outside. Via the contact pins 56, the input signals may, for example, be routed to the integrated circuits on the semiconductor substrates 32, 34, or the output signal may be routed externally.

In deviation from conventional electronic components, in the new safety switching device, at least two semiconductor substrates 32, 34 are arranged within the electronic component 38. The semiconductor substrates 32, 34 are preferably stacked covering one another, so that they form a cuboid stack 36. Each semiconductor substrate contains one independent semiconductor structure forming a signal processing channel. Coupling of the integrated circuits of the first semiconductor substrate 32 to the semiconductor structures of the second semiconductor substrate 34 may be implemented within the electronic component 38 via the conducting paths 54 on the carrier 52 within the DIP housing, or via a connection between the connecting pins 56 outside the housing. Particularly preferably, the integrated circuits are, however, already coupled to one another inside the stack 36. As explained in greater detail below based on FIG. 3, for this purpose, vertical connections are integrated into the semiconductor substrates 32, 34 parallel to the vertical axis 58 of the chip stack 36.

At the end of fabrication, the DIP housing is provided with a cover part, which is not depicted here. The cover part is applied above the conducting paths 54 and the chip stack 36. The conducting paths 54 and the chip stack 36 are thus enclosed inside the DIP housing and are thus securely protected from changes and environmental influences. Likewise, a subsequent change in the structure of the signal processing channels or the coupling thereof is no longer possible, or possible only to a limited degree.

It should be understood that a DIP housing as depicted here is only one possible housing form in which a chip stack 36 described here may be arranged, and is not to be understood as being limiting. Other common housing forms, for example, a small-outline (SO) housing using SMD technology, are likewise conceivable for the design of a one-piece electronic component provided here. In addition, in another exemplary embodiment, packaging of the chip stack 36 could also be achieved by molding material which encloses the chip stack 36 and which is deposited in a form-fitting manner around the semiconductor substrates 32, 34. By packaging the chip in a housing and/or by enclosing the chip in a molding material, an integrated, multichannel logic component is obtained which, for example, may be positioned on a printed circuit board during automated placement processes.

Figure 3:
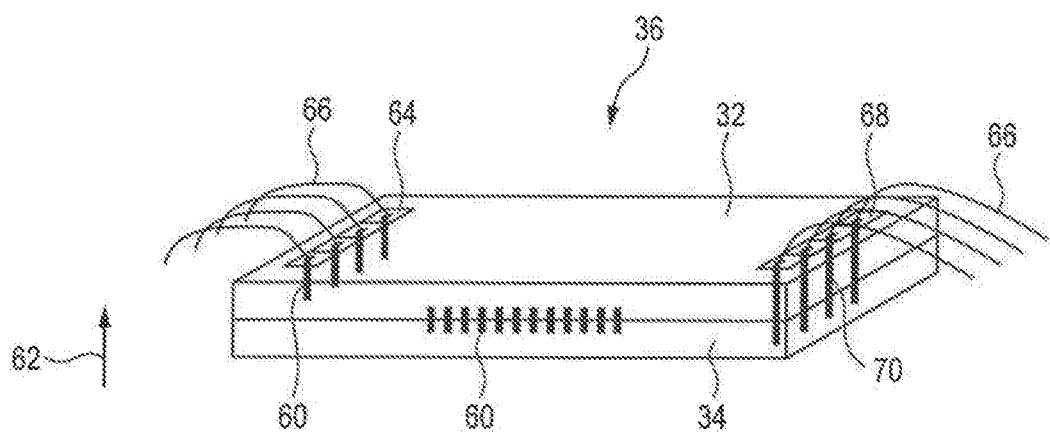
FIG. 3 shows a schematic representation of an exemplary embodiment of a chip stack of the new safety switching device.

FIG. 3 shows a simplified schematic representation of an exemplary embodiment of a chip stack 36. In this exemplary embodiment, the chip stack 36 comprises a first and a second semiconductor substrate 32, 34 which are arranged above one another into a stack. Semiconductor structures are arranged on the semiconductor substrates 32, 34 forming a monolithic circuit having active and passive components. In the case depicted here, an electronic circuit of a first signal processing channel 28 is arranged on the first semiconductor substrate 32, and an electronic circuit of a second signal processing channel 30 is arranged on the second semiconductor substrate 34.

During fabrication, the semiconductor substrates 32, 34 may initially be manufactured independently of one another and provided with a corresponding semiconductor structure. It is also conceivable that the two semiconductor substrates 32, 34 are initially part of a common base semiconductor substrate, on which multiple semiconductor structures for different chips are simultaneously configured. Subsequently, the base semiconductor substrate is diced into multiple single chips which are in turn placed above one another into a chip stack. However, to prevent common-cause faults, the individual semiconductor substrates of the chip stack 36 preferably come from different fabrication slices.

The chip stack 36 is not limited to the use of particular semiconductor substrates and base materials. In addition to common silicon semiconductors, for example, organic semiconductors, so-called plastic electronics, may also be used. Preferably, the chip stack 36 comprises very thin semiconductor substrates, wherein sufficient stability may be achieved via the stacking. Likewise, the semiconductor substrates do not necessarily have to be identical. A design using semiconductor substrates having different material thicknesses is also conceivable. For example, the base layer could be formed from a semiconductor substrate which is thicker than the other layers of the stack 36, in order to provide a stable base for the stack 36.

The integrated circuits on the semiconductor substrates are initially independent of one another and are coupled only after they are stacked together. The coupling takes place externally or within a stack via vertical contact elements 60. In the case depicted here, the chip stack 36 comprises multiple vertical contact elements 60 for the coupling. The vertical contact elements 60 are conductors which are configured parallel to the stack direction 62 of the chip stack 36. The vertical contact elements 60 are referred to as "through silicon vias" (TSVs) and establish an electrical connection between two semiconductor substrates. The vertical contact elements 60 are holes or recesses in the semiconductor substrates which are generated by drilling or particular etching methods. The holes in the semiconductor substrates contact the semiconductor structures in the semiconductor substrate and extend up to the surface, at least on one side of the semiconductor substrate. The holes are filed with conductive material such as copper or aluminum, and are arranged flush, one above the other, in the stack of the semiconductor substrates, so that the conductive material in a hole of the first semiconductor substrate 32 is in electrical contact with the conductive material of another hole in the second semiconductor substrate 34. In this way, direct connections may be established between the semiconductor structures of the first semiconductor substrate 32 and the second semiconductor substrate 34, whereby virtually latency-free interprocess communication between the two semiconductor structures is possible.

It should be understood that alternatively, a connection between the semiconductor substrates 32, 34, as previously described with respect to FIG. 2, may also be established outside the chip stacks 36. For this purpose, the contacts of the semiconductor structures on the semiconductor substrates are routed to the outside and are preferably still interconnected inside the one-piece component.

For contacting the semiconductor structures of the first semiconductor substrates 32, first contact surfaces 64, which are contactable via bonding wires 66 in a manner known per se, are illustratively arranged here on the surface of the first semiconductor substrate 32. In this preferred exemplary embodiment, in addition, second contact surfaces 68 are arranged on the surface of the first semiconductor substrate 32, via which the semiconductor structures of the second semiconductor substrate 34 are contactable. For this purpose, the second contact surfaces 68 are connected to the semiconductor structures of the second semiconductor substrate 34 via additional vertical contact elements 70 in the manner previously described. Advantageously, the common methods for contacting unpackaged semiconductor chips may thus also be used for contacting the unpackaged chip stack 36. Alternatively or in addition, contact surfaces which are contactable externally may also be configured on the second semiconductor substrate.

Alternatively to the bonding wires 66, other options for contacting the unpackaged chip stack 36 are conceivable, for example, a flip-chip assembly, also known as a controlled-collapse chip connection (C4). In the flip-chip assembly, the unpackaged chip stack 36 is mounted downwards on a carrier directly to the active contacting side of one of the semiconductor substrates 32, 34, without additional connecting wires. This results in particularly small dimensions of the housing and short conductor lengths. Short circuits caused by bonding wires coming into contact may thus be eliminated in a particularly simple and effective manner. In addition, with the flip-chip bonding technology, the connection of all contacts takes place simultaneously; thus, the fabrication time may be reduced. To bond the chips, in addition to soldering and conductive bonding, pressure welding (thermal bonding) may also be used as a joining method. In addition, the flip-chip assembly has the advantage that during contacting, generally only a slight mechanical stress is exerted on the chip to be contacted. Thus, very thin and porous semiconductor substrates 32, 34 may also be used for creating chip stack 36. A chip assembled using the flip-chip method is generally no longer separately packaged, but is provided with an alloy or filling compound for protection from environmental influences and changes. The fabrication of such a "package" is particularly economical.

Figure 4:
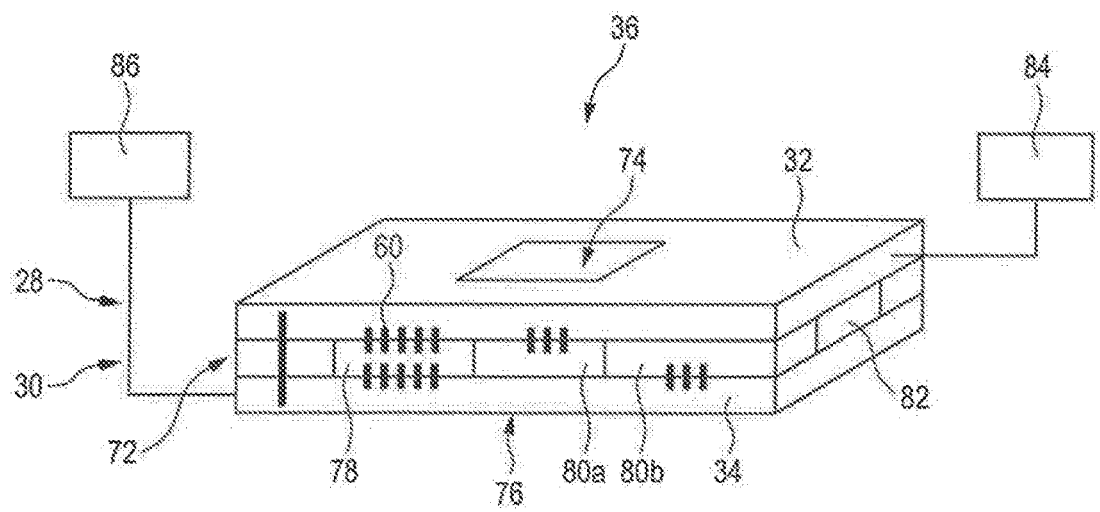
FIG. 4 shows a schematic representation of a preferred exemplary embodiment of a chip stack of the new safety switching device.

FIG. 4 shows a simplified schematic representation of a particularly preferable exemplary embodiment of a chip stack 36. In this exemplary embodiment, the chip stack 36 is formed from a first semiconductor substrate 32, a second semiconductor substrate 34, and an additional semiconductor substrate 72. The first semiconductor substrate 32 and the second semiconductor substrate 34 are configured essentially identically. Thus, the first semiconductor substrate 32 comprises a first signal processing unit 74 in the form of an integrated circuit, and the second semiconductor substrate 34 comprises a second signal processing unit 76 in the form of an integrated circuit.

In a particularly preferable exemplary embodiment, the first and second signal processing units 74, 76 are functionally identical, but are configured diversely with respect to one other, in order to be able to reduce the risk of common-cause faults during signal processing. The first signal processing unit 74 is associated with the first signal processing channel 28, and the second signal processing unit 76 is associated with the second signal processing channel 30. The first and the second signal processing units 74, 76 process the input signal in parallel and generate an output signal as a function of the input signal, independently of one another. Preferably, only the first and second signal processing units 74, 76 are arranged on the first and the second semiconductor substrates 32, 34.

The first and second signal processing units 74, 76 function together as a fault-tolerant system and process the input signal in parallel. Such redundancy is referred to as dual modular redundancy (DMR) and provides a high level of robustness with respect to faults. DMR systems can reliably detect faults, but cannot readily determine the channel in which a fault has occurred. For this reason, in another exemplary embodiment, the safety switching device could comprise at least one additional signal processing unit, preferably also integrated into the one-piece electronic component, whereby triple redundancy is generated. Systems having triple redundancy are also referred to as triple modular redundancy (TMR) systems and, for example, are used in aircraft or in systems with high demands with respect to availability. As well as being able to detect faults, TMR systems can also remedy them based on the majority principle.

In this exemplary embodiment, the signal processing units 74, 76 are furthermore respectively driven by a separate processor clock 88. Preferably, the processor clocks of the first and second signal processing units 74, 76 are phase-shifted with respect to one other. Thus, the signal processing units 74, 76 process the input signal in parallel, but with a slight time offset. Thereby, fail-safety may be further increased, since a disturbance occurring simultaneously on both channels, for example, a brief voltage spike, may be reliably detected.

In addition, in this preferred exemplary embodiment, the additional semiconductor substrate 72 is arranged between the first semiconductor substrate 32 and the second semiconductor substrate 34. The additional semiconductor substrate 72 comprises one or multiple separate integrated circuits which form a control and memory structure which may be coupled to the integrated circuits of the first semiconductor substrate 32 and/or the second semiconductor substrate 34. In the example depicted here, the control and memory structure comprises a comparator 78, memory ranges 80, and a "watchdog" 82, which may assist with the signal processing or may monitor proper functioning of the signal processing units 74, 76.

The comparator 78, for example, is an electronic circuit which compares two digital values. The "watchdog" 82 is an integrated circuit which can forestall a total failure of the electronic component due to software malfunction. Thus, the "watchdog" is, for example, configured as a counter which is set to a particular value at regular intervals by the software and is continuously decremented in terms of hardware. If the counter reaches the value 0, a malfunction of the software may be assumed, and the "watchdog" executes a predetermined response which results here in particular in the triggering of the safety function of the safety switching device. The memory areas 80 may, for example, be random access memory for the processing units 74, 76 or read-only memory having stored parameters of the safety switching device.

It should be understood that the additional semiconductor substrate 72, as depicted here, does not necessarily have to be arranged between the first and the second semiconductor substrates 32, 34 in the chip stack 36. Alternatively, the additional semiconductor substrate 72 could also be arranged above or below the first and the second semiconductor substrates 32, 34. The arrangement depicted here is particularly preferable if both the first and the second signal processing units 74, 76 are coupled to the control and memory structure of the additional semiconductor substrate 72. In addition, particularly good protection from radiation and wave influences can be provided by the first and second semiconductor substrates 32, 34 essentially covering the additional semiconductor substrate 72 completely.

A coupling of the integrated circuits on the first, the second, and the additional semiconductor substrates 32, 34, 72 is achieved via vertical contact elements 60, as previously described with reference to FIG. 3. Likewise, as previously described, contacting of the semiconductor substrates may also be achieved via contact surfaces on the surface and additional vertical contact elements (not depicted here).

For example, in the case depicted here, the comparator 78 is coupled both to the first signal processing unit 74 on the first semiconductor substrate 32 and to the second signal processing unit 76 on the second semiconductor substrate 34. Thereby, the signal processing units 74, 76 may be connected to the comparator 78 very efficiently and homogeneously, and having virtually any width. A comparison of values between the first signal processing unit 74 and the second signal processing unit 76 may thus be carried out in a single operating cycle, in a virtually latency-free manner.

With respect to the memory areas 80, the contact elements 60 may be arranged in such a way that the first signal processing unit 74 may exclusively access a first memory area 80a, and the second signal processing unit 76 may exclusively access a second memory area 80b. The "watchdog" 82 may in turn advantageously be connected to both signal processing units 74, 76 and monitor their correct functionality. In addition, it is also possible in this configuration that the first semiconductor substrate 32 is directly connected to the second semiconductor substrate 34, in that a vertical contact element is routed from the first semiconductor substrate 32 through the additional semiconductor substrate 72 to the second semiconductor substrate 34.

Alternatively to the depiction in FIG. 4, the first, second, and additional semiconductor substrates 32, 34, 72 may additionally have different material properties and in particular different substrate thicknesses. Preferably, the additional semiconductor substrate 72 is thicker than the first and the second semiconductor substrates 32, 34, in order to enable a shielding of the two signal processing units 74, 76 from one another. Thus, by means of a thicker additional semiconductor substrate 72, crosstalk from the first signal processing unit 74 to the second signal processing unit 76 and vice-versa may be physically eliminated.

Finally, FIG. 4 shows a first and a second voltage supply 84, 86, which are configured to be separate from one another. The first voltage supply 84 is coupled to the first semiconductor substrate 32, and the second voltage supply 86 is coupled to the second semiconductor substrate 34. The integrated circuits of the first semiconductor substrate 32 are supplied with a supply voltage via the first voltage supply 84, and the integrated circuits of the second semiconductor substrate 34 are supplied with a supply voltage via the second voltage supply 86. Preferably, the first and the second voltage supplies 84, 86 respectively comprise an overvoltage monitoring unit (not depicted here). The overvoltage monitoring unit is configured to decouple the voltage supply in the case of an overvoltage, for example, via a crowbar circuit.

It should be understood that the structures shown in FIG. 4 may be combined with one another arbitrarily in another exemplary embodiment. The chip stack 36 is thus not limited to the three semiconductor substrates 28, 30, 72 shown. In other advantageous embodiments, additional semiconductor substrates and/or other layers, for example, insulation layers, may be arranged in the chip stack 36. It is also conceivable that a plurality of the systems shown in FIG. 4 is accommodated in a chip stack in order to implement extremely space-saving, n-channel, highly available, and fault-tolerant "systems on stack." Overall, it is thus possible to create highly cost-efficient, flexible, and safe safety switching devices having dual or triple redundancy, which are able to conform to the requirements of the SIL3 safety integrity levels.

What is claimed is:

1. An electronic safety switching device comprising at least a first and a second signal processing channel to which input signals are supplied for signal processing, and which provide processed output signals,
    wherein the first and the second signal processing channels process the supplied input signals redundantly with respect to one another, and each of the first and the second signal processing channel is formed as an integrated circuit,
    wherein the first signal processing channel is arranged monolithically on a first semiconductor substrate, and the second signal processing channel is arranged monolithically on a second semiconductor substrate, and
    wherein the first and the second semiconductor substrates are combined into a stack to form a one-piece electronic component.

2. The electronic safety switching device according to claim 1, wherein the stack comprises an additional semiconductor substrate.

3. The electronic safety switching device according to claim 2, wherein the first semiconductor substrate comprises a first signal processing unit, the second semiconductor substrate comprises a second signal processing unit, and the additional semiconductor substrate comprises a control and memory structure, wherein the first and the second signal processing units are coupled to the control and memory structure.

4. The electronic safety switching device according to claim 3, wherein the control and memory structure comprises a comparator for comparing the first and second signal processing units, wherein the comparator is directly connected to the first and the second signal processing units.

5. The electronic safety switching device according to claim 2, wherein the additional semiconductor substrate is arranged in the stack between the first and the second semiconductor substrates.

6. The electronic safety switching device according to claim 1, wherein the first and the second semiconductor substrates are arranged spatially distanced from one another in the stack.

7. The electronic safety switching device according to claim 1, wherein an insulation layer and/or an additional semiconductor substrate is arranged between the first and the second semiconductor substrates.

8. The electronic safety switching device according to claim 1, wherein the stack comprises at least two semiconductor substrates and at least one vertical contact element, wherein the vertical contact element electrically connects the at least two semiconductor substrates.

9. The electronic safety switching device according to claim 1, wherein the first semiconductor substrate comprises a first signal processing unit, and the second semiconductor substrate comprises a second signal processing unit, wherein the first signal processing unit comprises an operating cycle which is time-shifted with respect to the second signal processing unit.

10. The electronic safety switching device according to claim 1, further comprising a first voltage supply, and a second voltage supply which is separate from the first voltage supply, and
    wherein the first voltage supply is associated with the first semiconductor substrate, and the second voltage supply is associated with the second semiconductor substrate.

11. In an electronic safety switching device, a microchip comprising at least a first and a second signal processing channel to which input signals are supplied for signal processing, and which provide processed output signals,
    wherein the first and the second signal processing channels process the supplied input signals redundantly with respect to one another, and each of the first and the second signal processing channel is formed as an integrated circuit,
    wherein the first signal processing channel is arranged monolithically on a first semiconductor substrate, and the second signal processing channel is arranged monolithically on a second semiconductor substrate, and
    wherein the first and the second semiconductor substrates are combined into a stack to form a one-piece electronic component.

* * * * *